United States Patent
Kaynak et al.

(10) Patent No.: US 11,398,835 B1
(45) Date of Patent: Jul. 26, 2022

(54) MANAGING DEFECTIVE BITLINE LOCATIONS IN A BIT FLIPPING DECODER

(71) Applicant: Micron Technology, Inc., Boise, ID (US)

(72) Inventors: Mustafa N. Kaynak, San Diego, CA (US); Sivagnanam Parthasarathy, Carlsbad, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 17/395,024

(22) Filed: Aug. 5, 2021

(51) Int. Cl.
 H03M 13/00 (2006.01)
 H03M 13/11 (2006.01)
 H03M 13/09 (2006.01)
 H03M 13/15 (2006.01)

(52) U.S. Cl.
 CPC ..... H03M 13/1108 (2013.01); H03M 13/093 (2013.01); H03M 13/098 (2013.01); H03M 13/1575 (2013.01)

(58) Field of Classification Search
 CPC ........... H03M 13/1108; H03M 13/093; H03M 13/096; H03M 13/095; H03M 13/1575
 See application file for complete search history.

(56) References Cited

U.S. PATENT DOCUMENTS

| | | | | |
|---|---|---|---|---|
| 9,619,327 B2 * | 4/2017 | Ha | ........................ | G11C 29/52 |
| 9,934,082 B2 * | 4/2018 | Tomishima | ......... | G06F 11/1076 |
| 10,097,208 B2 * | 10/2018 | Ilani | .................. | H03M 13/3746 |
| 10,180,874 B2 * | 1/2019 | Bazarsky | ........... | H03M 13/1102 |
| 10,498,362 B2 * | 12/2019 | Hanham | ........... | H03M 13/3715 |
| 10,707,899 B2 * | 7/2020 | Bhatia | ..................... | G11C 29/42 |
| 10,877,840 B2 * | 12/2020 | Kumar | ................ | G06F 11/1068 |
| 10,936,408 B2 * | 3/2021 | Wu | ..................... | H03M 13/152 |
| 11,018,695 B1 * | 5/2021 | Zhang | ................ | H03M 13/1108 |
| 11,063,607 B2 * | 7/2021 | Palangappa | ......... | H03M 7/6005 |
| 11,082,069 B1 * | 8/2021 | Steiner | ................ | H03M 13/152 |

* cited by examiner

*Primary Examiner* — Esaw T Abraham
(74) *Attorney, Agent, or Firm* — Nicholson De Vos Webster & Elliott LLP (57) ABSTRACT

Methods, systems, and apparatuses include receiving a codeword stored in a memory device. The codeword has bits from defective bit locations and non-defective bit locations. A syndrome of a current copy of the codeword is determined. Channel information for non-defective bit locations is determined using the current copy of the codeword and the received codeword from the memory device. Energy function values are determined for bits of the codeword using the syndrome of the current copy. Determining the energy function values includes using the channel information for bits in non-defective bit locations and omitting channel information for bits in defective bit locations. One or more bits of the codeword are flipped in response to the energy function values for the one or more bits satisfying a bit flipping criterion. A corrected codeword that results from the flipping of the bits is returned.

20 Claims, 5 Drawing Sheets

MANAGING DEFECTIVE BITLINE LOCATIONS IN A BIT FLIPPING DECODER

TECHNICAL FIELD

The present disclosure generally relates to error correction in memory devices, and more specifically, relates to a bit flipping decoder that accounts for defective bitline locations.

BACKGROUND ART

A memory subsystem can include one or more memory devices that store data. The memory devices can be, for example, non-volatile memory devices and volatile memory devices. In general, a host system can utilize a memory subsystem to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Aspects of the present disclosure are directed to a bit flipping decoder that accounts for defective bitline locations. A memory subsystem can be a storage device, a memory module, or a hybrid of a storage device and memory module. Examples of storage devices and memory modules are described below in conjunction with FIG. 1. In general, a host system can utilize a memory subsystem that includes one or more components, such as memory devices that store data. The host system can provide data to be stored at the memory subsystem and can request data to be retrieved from the memory subsystem.

A memory device can be a non-volatile memory device. A non-volatile memory device is a package of one or more dice. One example of non-volatile memory devices is a negative-and (NAND) memory device. Other examples of non-volatile memory devices are described below in conjunction with FIG. 1. The dice in the packages can be assigned to one or more channels for communicating with a memory subsystem controller. Each die can consist of one or more planes. Planes can be grouped into logic units (LUN). For some types of non-volatile memory devices (e.g., NAND memory devices), each plane consists of a set of physical blocks, which are groups of memory cells to store data. A cell is an electronic circuit that stores information.

Depending on the cell type, a cell can store one or more bits of binary information, and has various logic states that correlate to the number of bits being stored. The logic states can be represented by binary values, such as "0" and "1", or combinations of such values. There are various types of cells, such as single-level cells (SLCs), multi-level cells (MLCs), triple-level cells (TLCs), and quad-level cells (QLCs). For example, a SLC can store one bit of information and has two logic states.

Low-Density Parity Check (LDPC) codes are commonly used for enabling error correction in memory subsystems. LDPC codes are a class of highly efficient linear block codes that include single parity check (SPC) codes. LDPC codes have a high error correction capability and can provide performance close to Shannon channel capacity. LDPC decoders utilize a "belief propagation" algorithm, which is based on the iterative exchange of reliability information, e.g., "beliefs." The MinSum algorithm (MSA), which is a simplified version of the belief propagation algorithm, can be used for decoding LDPC codes. MSA-based decoders use a relatively high amount of energy per bit (e.g., pico-joule per bit) for decoding codewords and hence are not well suited for energy conscious applications (such as mobile applications). Bit Flipping (BF) decoders have been introduced to address this problem. BF decoders use less energy per bit. BF decoders, however, provide lower error correction capability when compared to the error correction capability of MSA-based decoders.

A page of data stored in memory is formed by bitlines that are protected by error correction code (ECC) codewords. Some bitlines are deemed defective, e.g., due to physical manufacturing issues or detected during use of the memory subsystem. For example, a default error rate for bits on a defective bitline can be approximately fifty percent. Memory subsystems can use reserved, spare bitlines to swap into pages in place of defective bitlines to form complete pages of data. Not every bit of reserved (spare) bitlines, however, are used to swap the defective bitlines. As a result, the spare bitlines that are not used for swapping the defective bitlines are left unused.

Aspects of the present disclosure address the above and other deficiencies by providing a BF decoder that uses the known locations of defective bitlines. Rather than swapping out a defective bitline, embodiments can take into account the defective bitline location when determining energy function values for a codeword. As a result, embodiments of the BF decoder can treat defective bitlines as erasures (e.g., bitlines that can be handled differently during error correction, as described below with reference to the illustrations), lowering the codeword error rate without the inefficiencies of swapping bitlines. Using all spare bitlines as error correction code parity bits and treating defective bitlines as erasures improves the error correction of the bit flipping decoder. For example, if 100 bits were allocated as spare bitlines and 30 bitlines are defective, 30 of the 100 spare bits can be used to swap defective bitlines while the remaining 70 are not used. Alternatively, according to embodiments described below, all spare bitlines (100 in this example) can be used to store additional parity bits for the ECC and the 30 defective bits are marked as erasures or otherwise treated differently in the bit flipping decoder as described below. In other words, embodiments can efficiently use the spare bitlines allocated for defective bitline repairs (i.e., swaps) for ECC instead, resulting in improved error correction capability due to the use of a greater number of parity bits.

Figure 1:
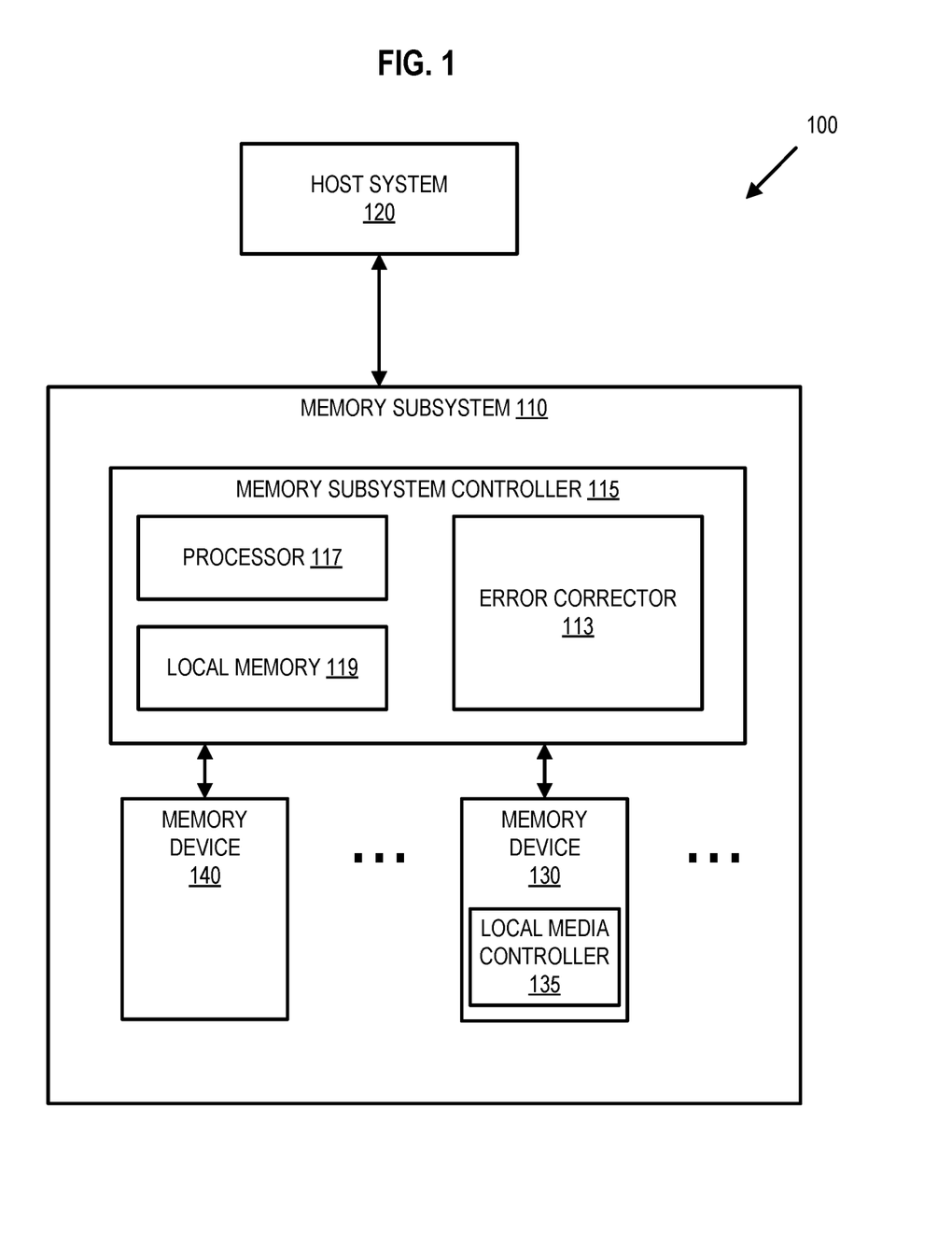
FIG. 1 illustrates an example computing system that includes a memory subsystem in accordance with some embodiments of the present disclosure.

FIG. 1 illustrates an example computing system 100 that includes a memory subsystem 110 in accordance with some embodiments of the present disclosure. The memory subsystem 110 can include media, such as one or more volatile memory devices (e.g., memory device 140), one or more non-volatile memory devices (e.g., memory device 130), or a combination of such.

A memory subsystem 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory subsystems 110. In some embodiments, the host system 120 is coupled to different types of memory subsystems 110. FIG. 1 illustrates one example of a host system 120 coupled to one memory subsystem 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory subsystem 110, for example, to write data to the memory subsystem 110 and read data from the memory subsystem 110.

The host system 120 can be coupled to the memory subsystem 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory subsystem 110. The host system 120 can further utilize an NVM Express (NVMe) interface to access components (e.g., memory devices 130) when the memory subsystem 110 is coupled with the host system 120 by the PCIe interface. The physical host interface can provide an interface for passing control, address, data, and other signals between the memory subsystem 110 and the host system 120. FIG. 1 illustrates a memory subsystem 110 as an example. In general, the host system 120 can access multiple memory subsystems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Although non-volatile memory devices such as NAND type memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory subsystem controller 115 (or controller 115 for simplicity) can communicate with the memory devices 130 to perform operations such as reading data, writing data, or erasing data at the memory devices 130 and other such operations (e.g., in response to commands scheduled on a command bus by controller 115). The memory subsystem controller 115 can include hardware such as one or more integrated circuits and/or discrete components, a buffer memory, or a combination thereof. The hardware can include digital circuitry with dedicated (i.e., hard-coded) logic to perform the operations described herein. The memory subsystem controller 115 can be a microcontroller, special purpose logic circuitry (e.g., a field programmable gate array (FPGA), an application specific integrated circuit (ASIC), etc.), or another suitable processor.

The memory subsystem controller 115 can include a processing device 117 (processor) configured to execute instructions stored in a local memory 119. In the illustrated example, the local memory 119 of the memory subsystem controller 115 includes an embedded memory configured to store instructions for performing various processes, operations, logic flows, and routines that control operation of the memory subsystem 110, including handling communications between the memory subsystem 110 and the host system 120.

In some embodiments, the local memory 119 can include memory registers storing memory pointers, fetched data, etc. The local memory 119 can also include read-only memory (ROM) for storing micro-code. While the example memory subsystem 110 in FIG. 1 has been illustrated as including the memory subsystem controller 115, in another embodiment of the present disclosure, a memory subsystem 110 does not include a memory subsystem controller 115, and can instead rely upon external control (e.g., provided by an external host, or by a processor or controller separate from the memory subsystem 110).

In general, the memory subsystem controller 115 can receive commands or operations from the host system 120 and can convert the commands or operations into instructions or appropriate commands to achieve the desired access to the memory devices 130 and/or the memory device 140. The memory subsystem controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory subsystem controller 115 can further include host interface circuitry to communicate with the host system 120 via the physical host interface. The host interface circuitry can convert the commands received from the host system into command instructions to access the memory devices 130 and/or the memory device 140 as well as convert responses associated with the memory devices 130 and/or the memory device 140 into information for the host system 120.

The memory subsystem 110 can also include additional circuitry or components that are not illustrated. In some embodiments, the memory subsystem 110 can include a cache or buffer (e.g., DRAM) and address circuitry (e.g., a row decoder and a column decoder) that can receive an address from the memory subsystem controller 115 and decode the address to access the memory devices 130.

In some embodiments, the memory devices 130 include local media controllers 135 that operate in conjunction with memory subsystem controller 115 to execute operations on one or more memory cells of the memory devices 130. An external controller (e.g., memory subsystem controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory subsystem 110 includes an error corrector 113 that can perform error correction based on a bit flipping mechanism which uses defective bitline locations in determining energy function values for flipping bits in the decoding process. In some embodiments, the controller 115 includes at least a portion of the error corrector 113. For example, the controller 115 can include a processor 117 (processing device) configured to execute instructions stored in local memory 119 for performing the operations described herein. In some embodiments, an error corrector 113 is part of the host system 120, an application, or an operating system.

In some embodiments, the error corrector 113 is operative to encode and decode data stored in the memory device (e.g., an encoder and/or decoder). Encoding data using an error correcting code (ECC) allows for correction of erroneous data bits when the data is retrieved from the memory device. For example, the error corrector 113 can encode data received from the host system 120 and store the data and parity bits as codewords in the memory device 130. The error corrector 113 can further be operative to decode data stored in the memory device 130 to identify and correct erroneous bits of the data before transmitting corrected data to the host system 120. Although illustrated as a single component that can perform encoding and decoding of data, the error corrector 113 can be provided as separate components. In some embodiments, the error corrector 113 is operative to encode data according to a Low-density parity-check (LDPC) code. The error corrector 113 is operative to decode the codewords stored in the memory device 130 based on a BF decoder. As described below, the error corrector 113 implements an enhanced BF decoder that can perform bit flipping decoding while accounting for defective bitline locations.

In one embodiment, the error corrector 113 receives a codeword stored in a memory device. The error corrector 113 error corrects the codeword in a set of iterations, e.g., by flipping bits for one or more iterations. The bits are flipped according to determined energy function values for the bits and a bit flipping criterion. An energy function value of a codeword bit can be considered an indication of reliability information for the codeword bit. The determination of the energy function values depends on known defective bitline locations. Further details with regards to the operations of the error corrector 113 are described below.

Figure 2:
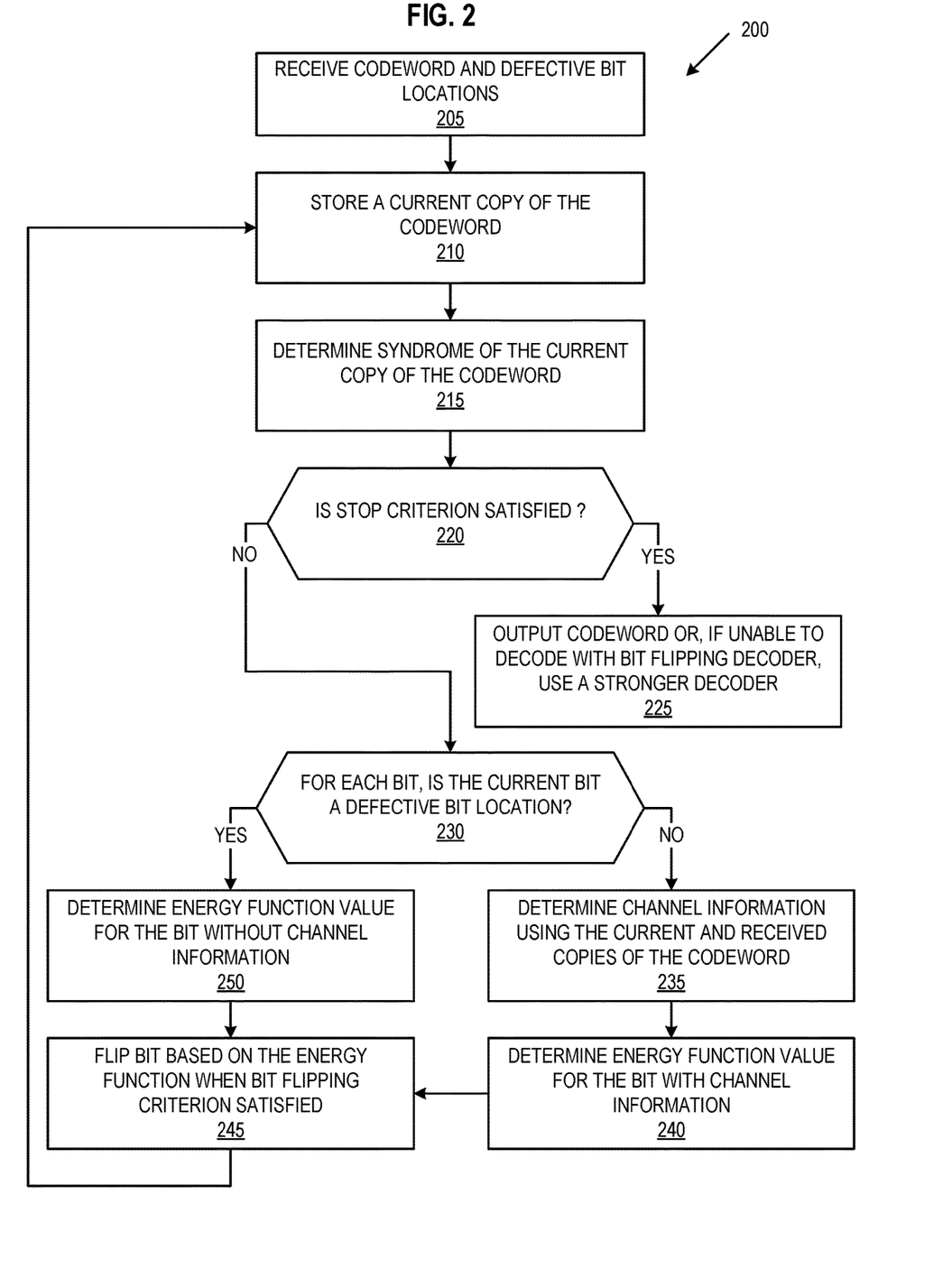
FIG. 2 is a flow diagram of an example method of bit flipping while accounting for defective bitline locations, in accordance with some embodiments of the present disclosure.

FIG. 2 is a flow diagram of an example method 200 of bit flipping while accounting for defective bitline locations, in accordance with some embodiments of the present disclosure. Method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the error corrector 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 205, the processing device receives a codeword from a memory device. In some embodiments, the codeword is received as a result of a read operation from a host system 120. The codeword can include a combination of data bits and parity check bits. The parity check bits are stored in the memory device for the data bits. The data bits and parity check bits are hard data bits that result from a hard read on a memory cell to determine the state of the memory cell (e.g., "0" or "1").

In one embodiment, the processing device also receives defective bit locations. In some embodiments, the processing device receives the defect information in coarser granularity such as defective bytes which refers to the case that the byte is defective even if a single bit of the byte is defective. For example, memory subsystem controller 115 can maintain a mapping of defective bit locations. When decoding a codeword, error corrector 113 can read or otherwise receive the defective locations within the codeword. In the case of coarse defect information, the decoder treats all bits or a subset of bits within the defective byte as erasures. Additionally, when encoding and storing a codeword, the memory subsystem can use the spare bitlines for additional ECC instead of swapping of spare memory locations for defective locations.

At operation 210, the processing device stores a current copy of the codeword. For example, the error corrector 113 can store the codeword in local memory 119 while iterating through the determination of syndromes, determination of energy function values, flipping bits, etc. In one embodiment, the processing device also maintains a copy of the codeword as received/read from the memory device(s), e.g., maintaining an original copy and a current copy having bits flipped during the decoding process.

At operation 215, the processing device generates or otherwise determines a syndrome for the current copy of the codeword. Generating a syndrome includes determining the parity checks for the codeword. For example, the processing device can use a parity check matrix to determine a syndrome for the codeword. Each bit (including defective bits) is subjected to a certain number of (one or more) parity checks.

At operation 220, the processing device determines whether a stop criterion is satisfied. A stop criterion can include an indication that no errors are detected for the codeword. In some embodiments, the stop criterion can include a null syndrome (i.e., zero unsatisfied parities) indicating that the codeword no longer includes erroneous bits. In some embodiments, the stop criterion can include a maximum number of iterations or a maximum amount of time. For example, the processing device is operative to perform the maximum number of iterations (e.g., 30 iterations, 40 iterations, 100 iterations, etc.). When the stop criterion is satisfied, method 200 proceeds to operation 225. When the stop criterion is not satisfied, method 200 proceeds to operation 230.

At operation 225, the processing device outputs the corrected codeword (e.g., in response to generating a null syndrome) or an indication of failure if the processing device was unable to decode the codeword. For example, the processing device can transmit the corrected codeword or the indication of failure to the host 120. If the processing device fails to decode the codeword using a bit flipping decoder as described below, the processing device can use an MSA decoder to decode the codeword. As a result, the processing device can use the more energy efficient bit flipping decoding process by default and use the less energy efficient MSA decoding process when the bit flipping decoder fails.

At operation 230, the processing device determines, for each bit of the codeword, if the current bit is a defective bit/bitline location. As described above, defective bit and/or bitline locations are received by the memory subsystem and can be treated as erasures in the bit flipping decoding process of individual codewords. Treating a bit/bitline as an erasure in the bit flipping decoding process, as described below, includes determining an energy function based on the number of satisfied parities for the bit while omitting channel information. In contrast, the processing device determines the energy function values for non-defective bit locations using both the number of satisfied parities and channel information. Method 200 proceeds to operation 235 to determine the energy function for bits that are not from defective bit locations (i.e., non-defective bit locations). Additionally, method 200 proceeds to operation 250 to determine the energy function for the bits that do map to defective locations.

At operation 235, the processing device determines channel information for the one or more bits in non-defective bit locations. The processing device determines channel information based on a current state of the bit as compared to the state of the bit when it was read from a memory device (also referred to as the hard bit). When the current state of the bit agrees with/matches the bit that was read from the memory device, the processing device can consider the bit to be more reliable. When the current state of the bit differs from the hard bit, the processing device can consider the bit to be less reliable. For example, the channel information of a bit can be defined as an XOR of the current state of the bit, which may have been flipped during one or more iterations of decoding, and the bit read from the memory device.

At operation 240, the processing device determines energy function values for bits mapped to non-defective bit locations. An energy function of a codeword bit can be considered an indication of reliability information for the bit. The processing device can determine an energy function value for a bit in a non-defective bit location of the codeword based on the number of satisfied parities for the bit and channel information for that bit. In some embodiments, a higher number of satisfied parities for a bit is an indication of a more reliable bit and results in a higher energy function value for the bit. Additionally, a lower number of satisfied parities for the bit is an indication of a less reliable bit and results in a lower energy function value for the bit. As described above, when the current state of the bit matches the value of the bit that was read from the memory device, the current state of the bit can be considered to be more reliable. Therefore, an energy function value of a bit is greater when the current state of the bit matches the hard bit received from the memory device than when the current state of the bit does not agree with the hard bit.

In one example, an energy function of a bit is determined by adding a number of satisfied parities of the bit (i.e., syndrome values determined in operation 215) with channel information for the bit. In a non-limiting example, an energy function of a bit in a non-defective bit location can be determined according to equation (1):

$$e(\text{bit}) = \text{NumberSatisfiedParities}(\text{bit}) + \text{Channel information}(\text{bit}) \quad (1)$$

A higher e(bit) value indicates a more reliable bit and lower e(bit) value indicates a less reliable bit. In one embodiment, the processing device determines the energy function value of a bit of the codeword by retrieving the energy function value from a lookup table based on the number of satisfied parity bits and channel information.

At operation 245, the processing device flips zero or more bits of the codeword when the energy function values for a bit of the codeword satisfies a bit flipping criterion. The processing device traverses the codeword and evaluates each bit of the codeword based on the corresponding bit's energy function value to determine whether to flip the bit. When the energy function value of a bit of the codeword does not satisfy the bit flipping criterion, the processing device does not flip the bit. When the energy function value of a bit of codeword satisfies the bit flipping criterion, the processing device flips the bit. In some embodiments, the bit flipping criterion is a bit flipping threshold. The processing device determines to flip a bit when the energy function value of the bit satisfies the bit flipping threshold. For example, the processing device can determine to flip a bit when the energy function value of the bit is less than or equal to the bit flipping threshold and to not flip the bit when the energy function value of the bit is greater than the bit flipping threshold.

At operation 250, the processing device determines energy function values for bits from defective bit locations. Defective bit locations have associated stored values/voltages and the processing device reads these locations. For example, an energy function of a bit in a defective bit location is determined as described above but omitting channel information for the bit. In a non-limiting example, an energy function for a bit in a defective bit location can be determined according to equation (2):

$$e(bit)=NumberSatisfiedParities(bit) \qquad (2)$$

Once again, a higher e(bit) value indicates a more reliable bit and lower e(bit) value indicates a less reliable bit. In one embodiment, the processing device determines the energy function value of a bit of the codeword by retrieving the energy function value from a lookup table based on the number of satisfied parity bits and channel information.

Similar to the description above, the processing device flips zero or more bits in defective bit locations at operation 245. Method 200 returns to operation 210 to store a current copy of the codeword (e.g., the state after flipping any bits during operation 245) and determine if a stop criterion is satisfied or if the processing device is to perform another iteration of bit flipping.

Figure 3:
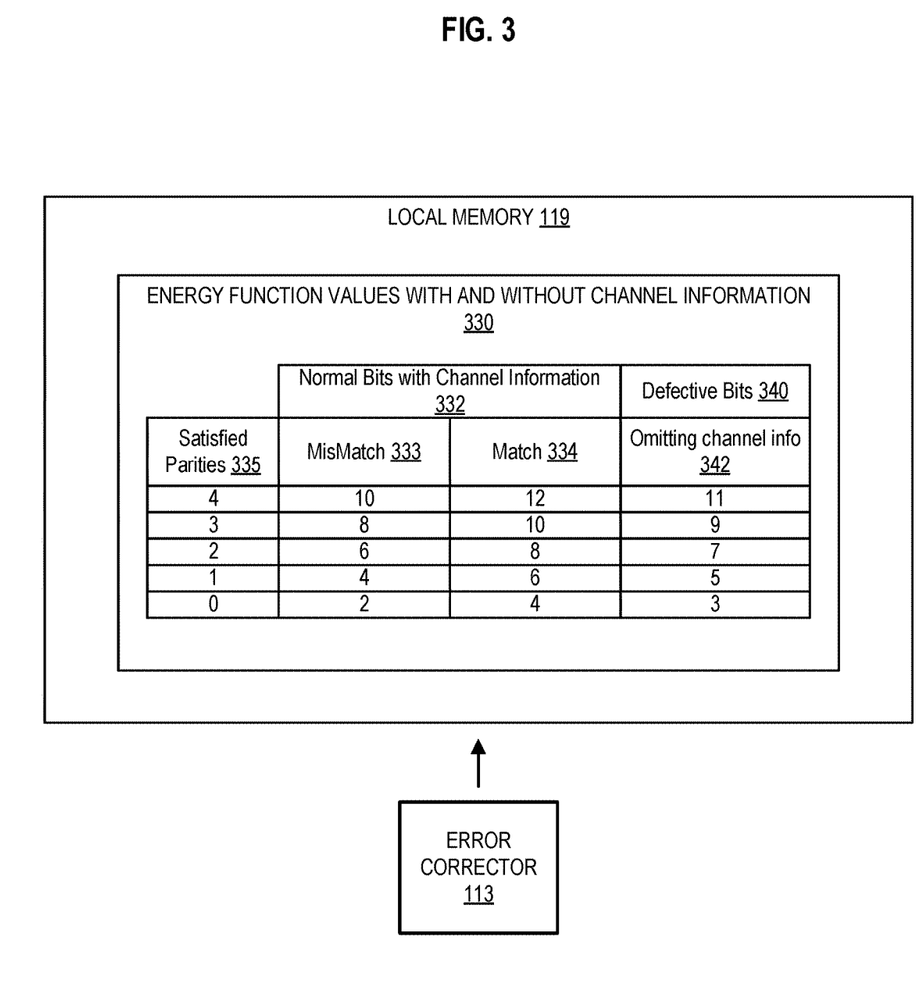
FIG. 3 illustrates an exemplary lookup table that can be used for determining energy function values of a bit of a codeword while accounting for defective bitline locations, in accordance with some embodiments.

FIG. 3 illustrates an exemplary lookup table 330 that can be used for determining energy function values of a bit of a codeword, in accordance with some embodiments. Although FIG. 3 illustrates example values for satisfied parities and energy function values of a bit of a codeword, the illustrated examples should be understood only as examples, other energy function values and/or satisfied parity numbers are possible. Table 330 includes exemplary energy function values that can be used for bits of a codeword with and without channel information based upon whether a given bit is in a defective or non-defective location.

The processing device determines an energy function value for a bit based on its associated number of satisfied parities and, for non-defective bit locations, channel information. For example, if a bit of the codeword is in a non-defective bit location, has 4 satisfied parities, and its current state is mismatched with the hard bit received from the memory device, error corrector 113 determines that the energy function value of the bit is 10. In another example, if a bit of the codeword is in a non-defective bit location, has 4 satisfied parities, and its current state matches with the hard bit received from the memory device, error corrector 113 determines that the energy function value of the bit is 12. In yet another example, if a bit of the codeword is in a defective bit location and has 4 satisfied parities, error corrector 113 determines that the energy function value of the bit is 11 (without using channel information).

Figure 4:
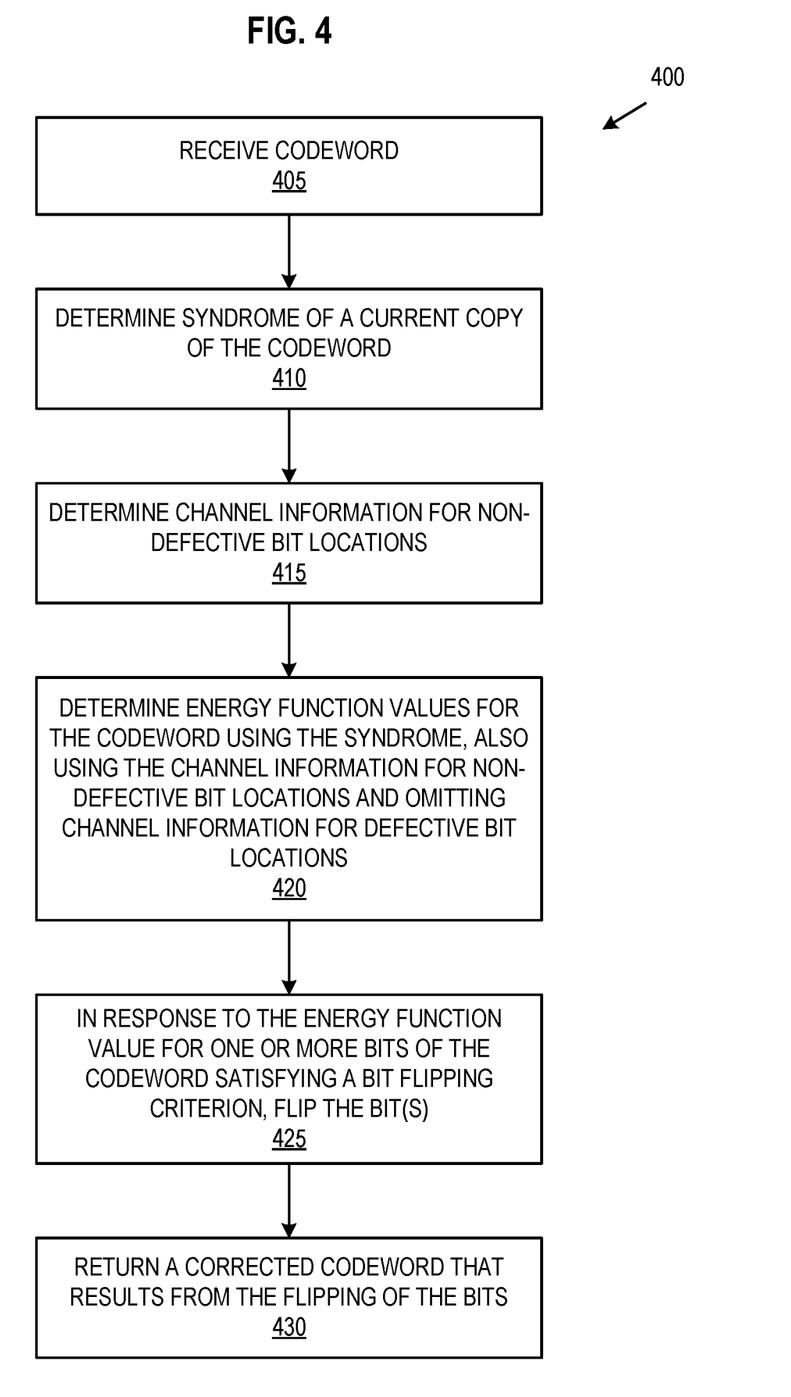
FIG. 4 is a flow diagram of another example method of bit flipping while accounting for defective bitline locations, in accordance with some embodiments of the present disclosure.

FIG. 4 is a flow diagram of another example method 400 of bit flipping while accounting for defective bitline locations, in accordance with some embodiments of the present disclosure. Method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the error corrector 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 405, the processing device receives a codeword from a memory device. For example, the processing device receives the codeword as described with reference to operation 205 above.

At operation 410, the processing device determines a syndrome of a current copy of the codeword. For example, the processing device determines the syndrome as described with reference to operation 215 above.

At operation 415, the processing device determines channel information for bits in non-defective bit locations. For example, the processing device determines the channel information as described with reference to operation 235 above.

At operation 420, the processing device determines energy function values for bits of the codeword using the syndrome determined in operation 410. Additionally, for bits in non-defective bit locations, the processing device uses channel information to determine energy function values (while omitting channel information for bits in defective bit locations). For example, the processing device determines the energy function values as described with reference to operations 240 and 250 above At operation 425, the processing device flips a bit of the codeword when the energy function values for a bit of the codeword satisfies a bit flipping criterion. For example, the processing device flips bits as described with reference to operation 245 above.

At operation 430, the processing device returns a corrected codeword that results from the flipping of the bits of the codeword. For example, the processing device outputs a decoded codeword as described with reference to operation 225 above.

Figure 5:
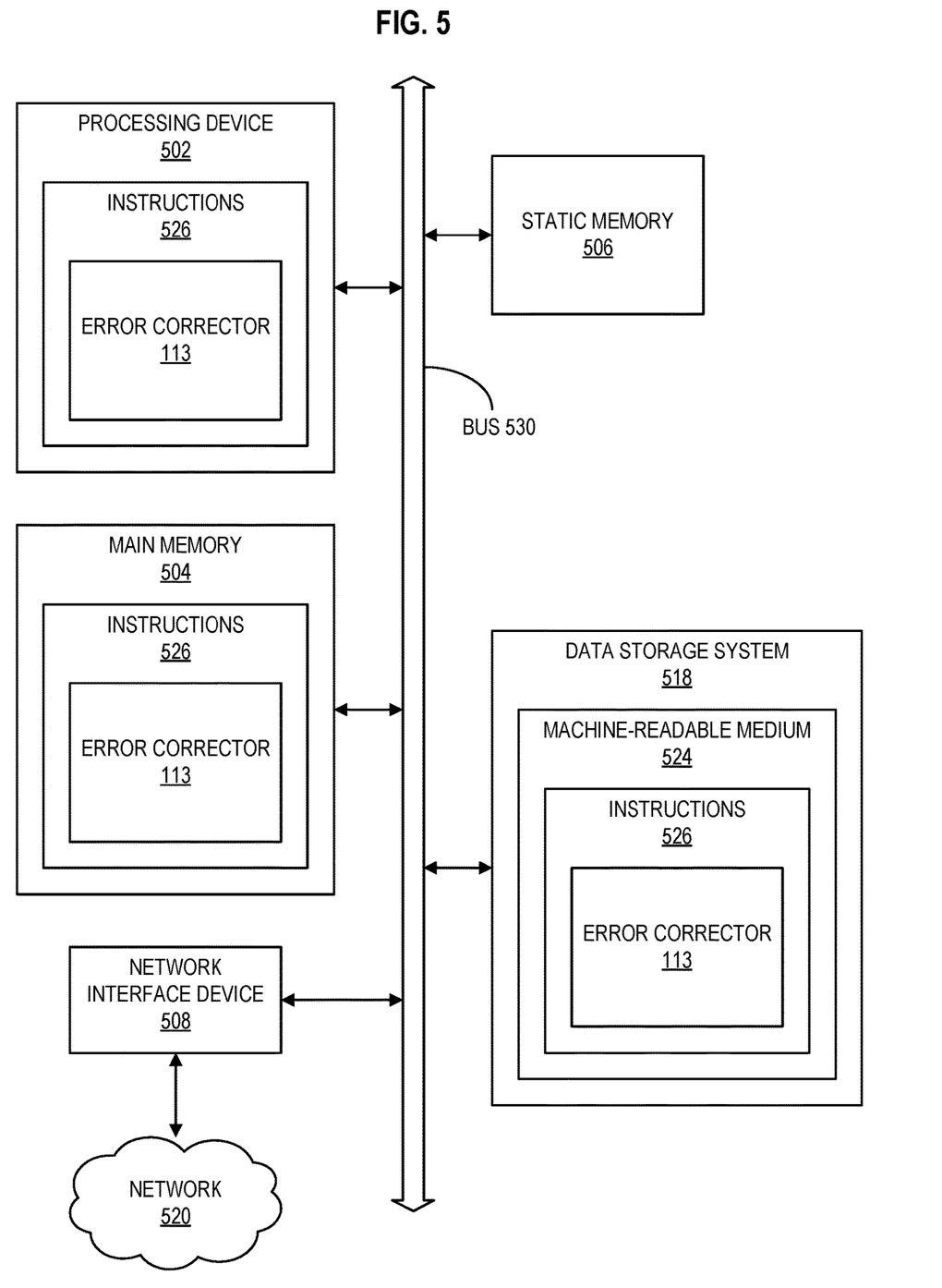
FIG. 5 is a block diagram of an example computer system in which embodiments of the present disclosure can operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory subsystem (e.g., the memory subsystem 110 of FIG. 1) or can be used to perform the operations of a controller (e.g., to execute an operating system to perform operations corresponding to the error corrector 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory subsystem 110 of FIG. 1.

In one embodiment, the instructions 526 include instructions to implement functionality corresponding to an error corrector (e.g., the error corrector 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. For example, a computer system or other data processing system, such as the controller 115, can carry out the computer-implemented methods 200 and 400 in response to its processor executing a computer program (e.g., a sequence of instructions) contained in a memory or other non-transitory machine-readable storage medium. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
   receiving a codeword stored in a memory device, the codeword having bits from defective bit locations and non-defective bit locations;
   determining a syndrome of a current copy of the codeword;
   determining channel information for non-defective bit locations using the current copy of the codeword and the received codeword from the memory device;
   determining energy function values for bits of the codeword using the syndrome of the current copy, wherein determining the energy function values includes using the channel information for bits in non-defective bit locations and omitting channel information for bits in defective bit locations;
   flipping one or more bits of the codeword in response to the energy function values for the one or more bits satisfying a bit flipping criterion; and
   returning a corrected codeword that results from the flipping of the bits of the codeword.

2. The method of claim 1, further comprising:
   updating the current copy of the codeword to reflect the one or more flipped bits.

3. The method of claim 1, wherein the determining the energy function values for bits of the codeword includes:
   retrieving an energy function value for a bit of the codeword from a look up table based on a number of satisfied parity checks.

4. The method of claim 1, wherein the channel information represents whether a current state of a bit in the current copy of the codeword is in a same or different state from a corresponding bit in the codeword as stored in the memory device.

5. The method of claim 1, further comprising:
   receiving a mapping of defective bit locations.

6. The method of claim 1, wherein the corrected codeword is returned in response to determining a stop criterion has been satisfied.

7. The method of claim 6, wherein the stop criterion is a null syndrome for the codeword.

8. A non-transitory computer-readable storage medium comprising instructions that, when executed by a processing device, cause the processing device to:
   receive a codeword stored in a memory device, the codeword having bits from defective bit locations and non-defective bit locations;
   determine a syndrome of a current copy of the codeword;
   determine channel information for non-defective bit locations using the current copy of the codeword and the received codeword from the memory device;
   determine energy function values for bits of the codeword using the syndrome of the current copy, wherein determining the energy function values includes using the channel information for bits in non-defective bit locations and omitting channel information for bits in defective bit locations;
   flip one or more bits of the codeword in response to the energy function values for the one or more bits satisfying a bit flipping criterion; and
   return a corrected codeword that results from the flipping of the bits of the codeword.

9. The non-transitory computer-readable storage medium of claim 8, wherein the processing device is further to:
   update the current copy of the codeword to reflect the one or more flipped bits.

10. The non-transitory computer-readable storage medium of claim 8, wherein the determining the energy function values for bits of the codeword includes:
    retrieving an energy function value for a bit of the codeword from a look up table based on a number of satisfied parity checks.

11. The non-transitory computer-readable storage medium of claim 8, wherein the channel information represents whether a current state of a bit in the current copy of the codeword is in a same or different state from a corresponding bit in the codeword as stored in the memory device.

12. The non-transitory computer-readable storage medium of claim 8, wherein the processing device is further to:
    receive a mapping of defective bit locations.

13. The non-transitory computer-readable storage medium of claim 8, wherein the corrected codeword is returned in response to determining a stop criterion has been satisfied.

14. The non-transitory computer-readable storage medium of claim 13, wherein the stop criterion is a null syndrome for the codeword.

15. A system comprising:
    a memory device; and
    a processing device, operatively coupled with the memory device, to:
      receive a codeword stored in a memory device, the codeword having bits from defective bit locations and non-defective bit locations;
      determine a syndrome of a current copy of the codeword;
      determine channel information for non-defective bit locations using the current copy of the codeword and the received codeword from the memory device;
      determine energy function values for bits of the codeword using the syndrome of the current copy, wherein determining the energy function values includes using the channel information for bits in non-defective bit locations and omitting channel information for bits in defective bit locations;
      flip one or more bits of the codeword in response to the energy function values for the one or more bits satisfying a bit flipping criterion; and
      return a corrected codeword that results from the flipping of the bits of the codeword in response to determining a stop criterion has been satisfied.

16. The system of claim 15, wherein the processing device is further to:
    update the current copy of the codeword to reflect the one or more flipped bits.

17. The system of claim 15, wherein the determining the energy function values for bits of the codeword includes:
    retrieving an energy function value for a bit of the codeword from a look up table based on a number of satisfied parity checks.

18. The system of claim 15, wherein the channel information represents whether a current state of a bit in the current copy of the codeword is in a same or different state from a corresponding bit in the codeword as stored in the memory device.

19. The system of claim 15, wherein the processing device is further to:
  receive a mapping of defective bit locations.

20. The system of claim 15, wherein the stop criterion is a null syndrome for the codeword.

* * * * *